US012291406B2

(12) United States Patent
Iura (10) Patent No.: US 12,291,406 B2
(45) Date of Patent: May 6, 2025

(54) TRANSFER ROBOT

(71) Applicant: DAIHEN Corporation, Osaka (JP)

(72) Inventor: Jun Iura, Osaka (JP)

(73) Assignee: DAIHEN Corporation

( * ) Notice: Subject to any disclaimer, the term of this patent is extended or adjusted under 35 U.S.C. 154(b) by 247 days.

(21) Appl. No.: 18/182,702

(22) Filed: Mar. 13, 2023

(65) Prior Publication Data

US 2023/0294931 A1 Sep. 21, 2023

(30) Foreign Application Priority Data

Mar. 18, 2022 (JP) ................................ 2022-044637

(51) Int. Cl.
*B65G 47/90* (2006.01)
(52) U.S. Cl.
CPC ........... *B65G 47/902* (2013.01); *B65G 47/90* (2013.01)
(58) Field of Classification Search
CPC .............................. B65G 47/902; B65G 47/90
See application file for complete search history.

(56) References Cited

U.S. PATENT DOCUMENTS

| | | | | |
|---|---|---|---|---|
| 5,944,476 A * | 8/1999 | Bacchi | ............. | H01L 21/68707 414/816 |
| 6,126,381 A * | 10/2000 | Bacchi | ............. | H01L 21/67766 414/754 |
| 11,020,852 B2 * | 6/2021 | Plaisted | ................. | B25J 9/1615 |
| 12,046,501 B2 * | 7/2024 | Tan | ................... | H01L 21/67766 |
| 2001/0041129 A1 * | 11/2001 | Tsuneda | ............ | H01L 21/67796 414/744.1 |
| 2009/0082895 A1 * | 3/2009 | Barker | .................... | H01L 21/68 414/800 |
| 2015/0153729 A1 | 6/2015 | Kurahashi et al. | | |
| 2015/0179488 A1 * | 6/2015 | Blank | ..................... | H01L 21/68 414/226.04 |
| 2017/0040203 A1 * | 2/2017 | Caveney | .......... | H01L 21/68707 |
| 2018/0019154 A1 * | 1/2018 | Yoshida | ................ | H01L 21/681 |
| 2018/0101165 A1 | 4/2018 | Kurahashi et al. | | |

FOREIGN PATENT DOCUMENTS

| | | | | |
|---|---|---|---|---|
| DE | 102016118462 A1 * | 3/2018 | .......... | B25J 11/0095 |
| JP | 2013049128 A * | 3/2013 | | |
| JP | 2015-195328 | 11/2015 | | |

* cited by examiner

*Primary Examiner* — Gerald McClain
(74) *Attorney, Agent, or Firm* — HSML P.C.

(57) ABSTRACT

A transfer robot includes a movable mechanism, a support base moved by the movable mechanism, a horizontal arm pivotable relative to the support base around a first vertical axis, a motor in the horizontal arm to pivot the arm, and a hand disposed above the arm and rotatable relative to the arm around a second axis parallel to the first axis. The hand holds a planar workpiece placed thereon. The arm includes a rotation stage for holding the planar workpiece placed thereon. The rotation stage is rotatable around a third axis parallel to the first axis and movable vertically along the third axis. The hand has a holding center corresponding to the center of the planar workpiece, where the holding center is moved along a rotational trajectory extending across the third axis in plan view. The rotation stage is rotated by the motor provided in the horizontal arm.

5 Claims, 7 Drawing Sheets

TRANSFER ROBOT

FIELD

The present disclosure relates to a transfer robot, in particular, a transfer robot transporting a planar workpiece like a semiconductor wafer.

BACKGROUND

Conventionally, a transfer robot has been used, for example, in semiconductor processes. Specifically, a transfer robot may be used to remove a wafer from a cassette and transfer them to a processing chamber, or to remove a processed wafer from the processing chamber and transfer them to a next process. Generally, this type of transfer robot includes a hand to hold a wafer placed thereon and is composed to transfer the wafer from a transferring source to a transferring destination with the wafer placed on the hand.

In one example, in transferring a wafer to a processing chamber, the wafer needs to be accurately positioned at each reference position in a rotational direction (θ direction) and a planar direction (X-Y direction) at a transferring destination. In order to correct the position of the wafer, a device for alignment operation (referred to as an "aligner") is used.

The conventional aligner, for example, includes a rotary table on which the wafer is placed, as shown in FIG. 3 of JP-A-2015-195328. The aligner also includes a sensor or sensors for detecting an amount of misalignment in the X-Y direction and an amount of misalignment in the θ direction from the reference position of the wafer placed on the rotary table. The wafer has a circumference and a notch (or an orientation flat, etc.) on the circumference. Thereby, for example, by continuously detecting the circumference of the wafer while rotating the wafer, the amount of misalignment in the X-Y direction of the center of the wafer placed on the rotary table can be detected. In addition, by detecting the notch while rotating the wafer, the amount of misalignment in the θ direction of the wafer placed on the rotary table can be detected.

Then, by rotating the rotary table in a predetermined direction considering the amount of misalignment detected as described above, the misalignment in the θ direction can be eliminated. After the hand picks up the wafer from the rotary table, the transfer robot corrects the hand position in the X-Y direction and transfers the wafer to the transferring destination, and thereby the misalignment in the X-Y direction can be eliminated.

The conventional aligner disclosed in JP-A-2015-195328 still has room for improvement in the following points. The aligner is independent of the transfer robot, which results in the increase of the cost of the transfer device (consisting both of the transfer robot and the aligner), while also needing a large floor space for the installation of the transfer device. In addition, the throughput may decrease due to extra time needed for moving the wafer between the transfer robot and the aligner, and the efficiency of the entire processing will deteriorate.

SUMMARY

An object of the present disclosure is to provide a transfer robot improved over conventional ones. In particular, an object of the present disclosure is to provide a transfer robot that can further reduce the time required for alignment operation.

To achieve the objects described above, the present disclosure provides the following technical features.

A transfer robot provided in accordance with a first aspect of the present disclosure may include: a movable mechanism; a support base moved by the movable mechanism; a horizontal arm pivotable relative to the support base around a first axis (pivot axis) that is vertical; a motor provided in the horizontal arm to pivot the horizontal arm; and a hand disposed above the horizontal arm and rotatable relative to the horizontal arm around a second axis (rotation axis) parallel to the first axis, where the hand is configured to hold a planar workpiece placed thereon. The horizontal arm is provided with a rotation stage configured to hold the planar workpiece placed thereon, and the rotation stage is rotatable around a third axis (rotation axis) parallel (or collinear) to the first axis and movable up and down along an axial direction of the third axis. The hand has a holding center corresponding to the center of the planar workpiece, where the holding center is moved along a rotational trajectory extending across the third axis in plan view. The rotation stage is rotated by an output of the motor provided in the horizontal arm.

Preferably, the rotation stage includes a rotation stage shaft for transmitting a rotational power to the rotation stage. The rotation stage shaft, an output shaft of the motor and the first axis are provided with respective pulleys around which a belt passes in common.

Preferably, the transfer robot further includes a reduction gear provided between the pulley on the first axis and the support base.

Preferably, the reduction ratio of the reduction gear is in a range of 1/160 to 1/50.

Preferably, the motor, the pulley on the output shaft of the motor, the rotation stage shaft, the pulley on the rotation stage shaft, the pulley on the first axis, and the belt are provided within the horizontal arm.

With the above configuration, a pivot trajectory around a holding center of the hand is configured to pass over the third axis in the plan view. The holding center of the hand, hence, can be positioned above the third direction of the rotation stage by pivoting the hand around the second axis.

The planar workpiece on the hand, which is transferred to a position above the rotation stage, is placed onto the rotation stage by elevating the stage. By continuously detecting the circumference of the planar workpiece with the predetermined sensor while rotating the rotation stage, an amount of misalignment of the center of the planar workpiece in the X-Y direction can be determined at the time when the planar workpiece is put onto the rotation stage from the hand. If the planar workpiece is a semiconductor wafer, it has a notch or an orientation flat on its circumference so that an amount of misalignment of the planar workpiece in the θ direction can simultaneously be detected. The misalignment in the θ direction can be eliminated by rotating the rotation stage in a predetermined direction considering the amount of misalignment detected as described above. The planar workpiece whose misalignment in the θ direction is eliminated in this manner is transferred onto the hand by lowering the rotation stage, and, considering the amount of misalignment detected as described above, the misalignment of the planar workpiece in the X-Y direction can be eliminated by correcting the hand in the X-Y direction and transferring to the transferring destination.

According to the transfer robot of the above configuration, alignment operation can be performed without a separate aligner, thus size and cost reduction of the entire transfer system can be achieved. In addition, the wafer can be moved between the hand and the rotation stage in a brief time, which results in that the time required for alignment operation is reduced and the processing efficiency of the entire process is improved.

Other features and advantages of the present disclosure will become more apparent from the detailed description given below with reference to the accompanying drawings.

EMBODIMENTS

The following describes preferred embodiments of the present disclosure with reference to the accompanying drawings.

Figure 1:
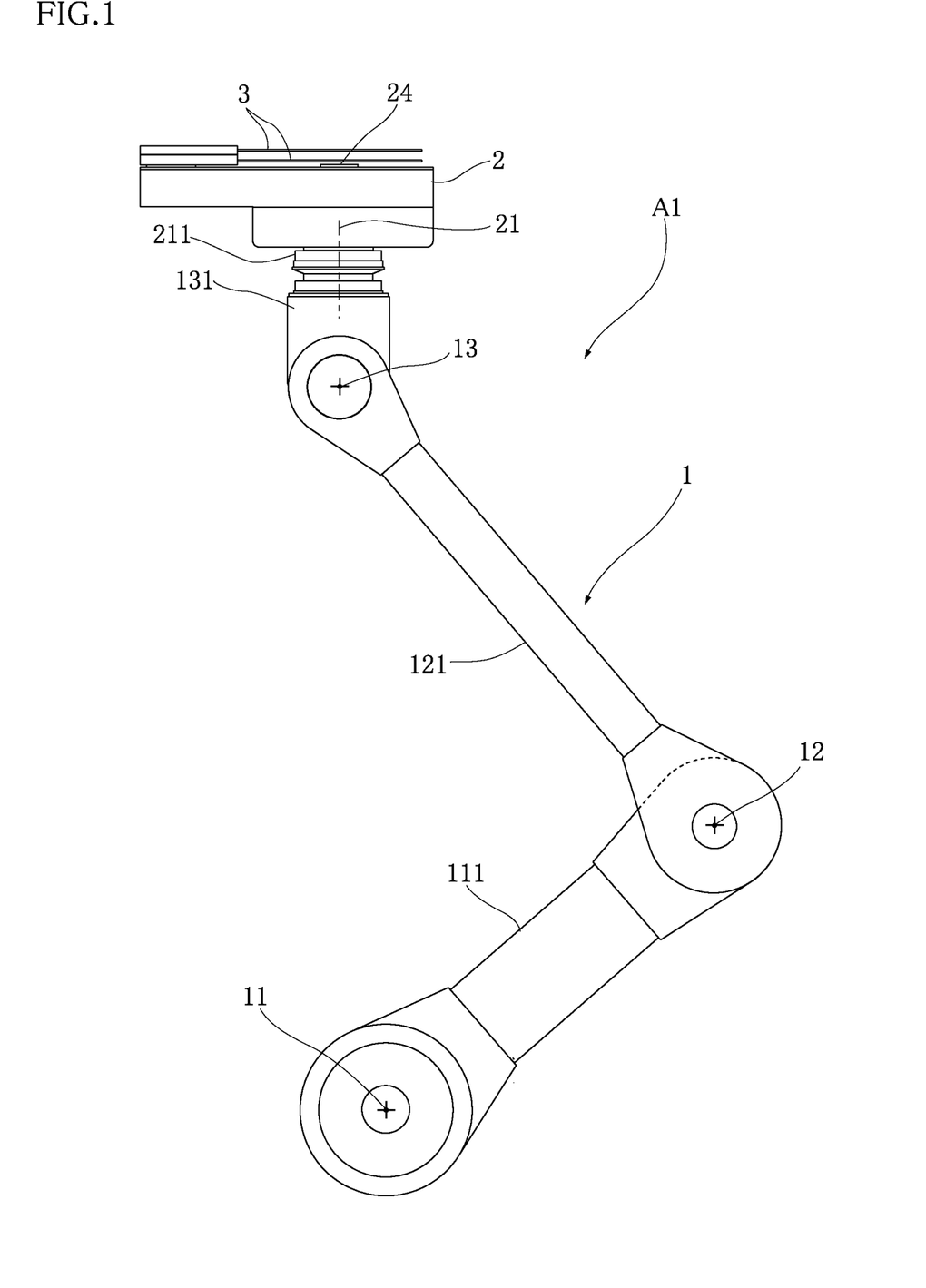
FIG. 1 is an overall elevation view of a transfer robot according to an embodiment of the present disclosure.

FIG. 1 schematically shows the overall configuration of a transfer robot A1 according to an embodiment of the present disclosure. The transfer robot A1 is configured to transfer a semiconductor wafer W, which is an example of planar workpiece.

The transfer robot A1 includes a movable mechanism (typically, an automatic machine such as a robot) 1, a horizontal arm 2, and a hand 3. The movable mechanism 1 has a first arm 111 pivotable (alternatively, rotatable, turnable, etc.) around a horizontal first axis 11, a second arm 121 pivotable around a horizontal second axis 12 at a tip or front end of the first arm 111, and a support base 131 rotatable around a horizontal third axis 13 at a tip or front end of the second arm 121. The movable mechanism 1 is configured to move the support base 131 to any position in the region that can be accessed by the lengths of the first arm 111 and second arm 121 in the vertical plane perpendicular to the first, second and third axes 11, 12, 13. The horizontal arm 2 is pivotably supported by the support base 131. The posture of the support base 131 is controlled so that the pivot shaft 21 of the horizontal arm 2 is parallel (or substantially parallel) to the vertical direction.

Figure 3:
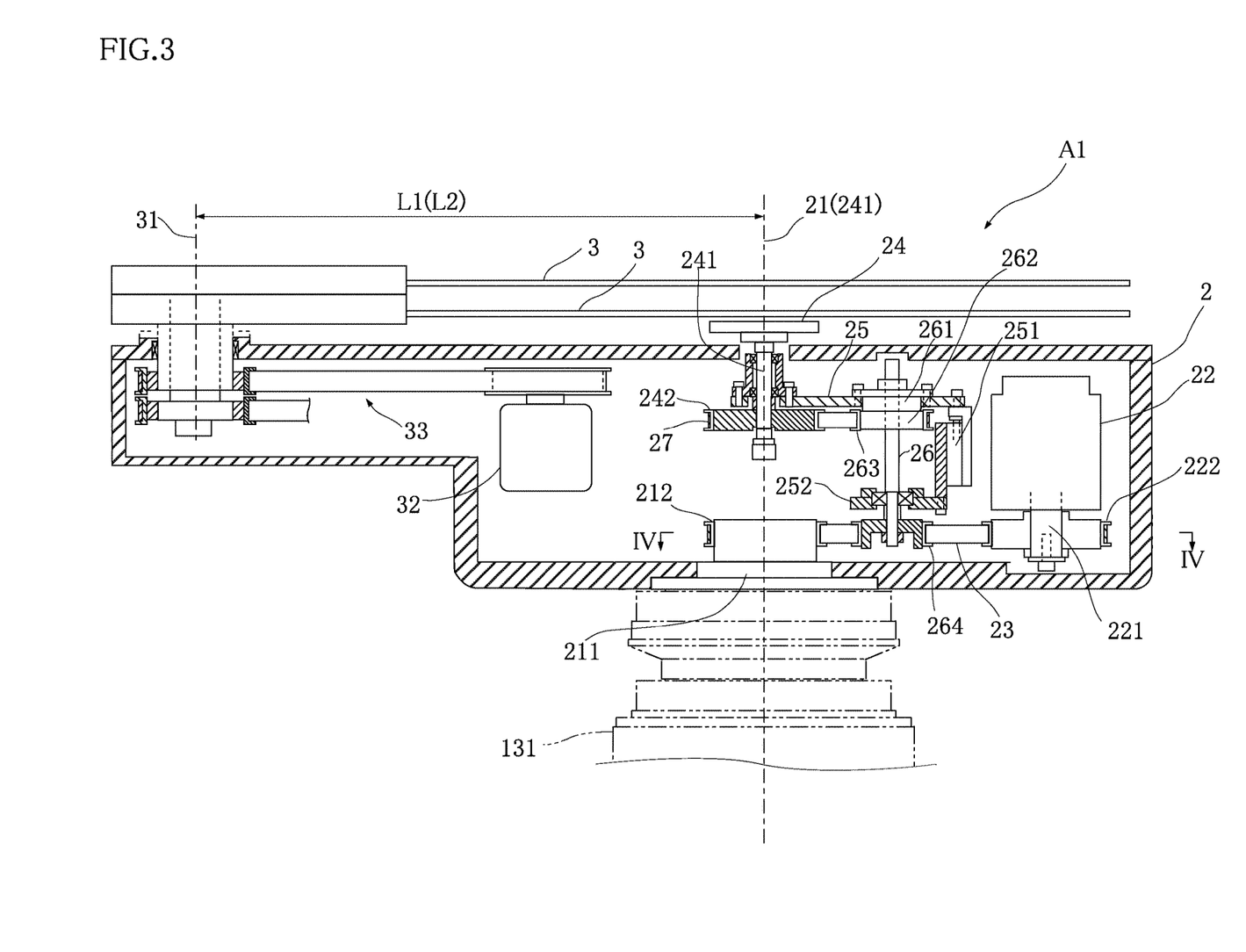
FIG. 3 is a sectional view taken along line III-III of FIG. 2 of the horizontal arm.
Figure 4:
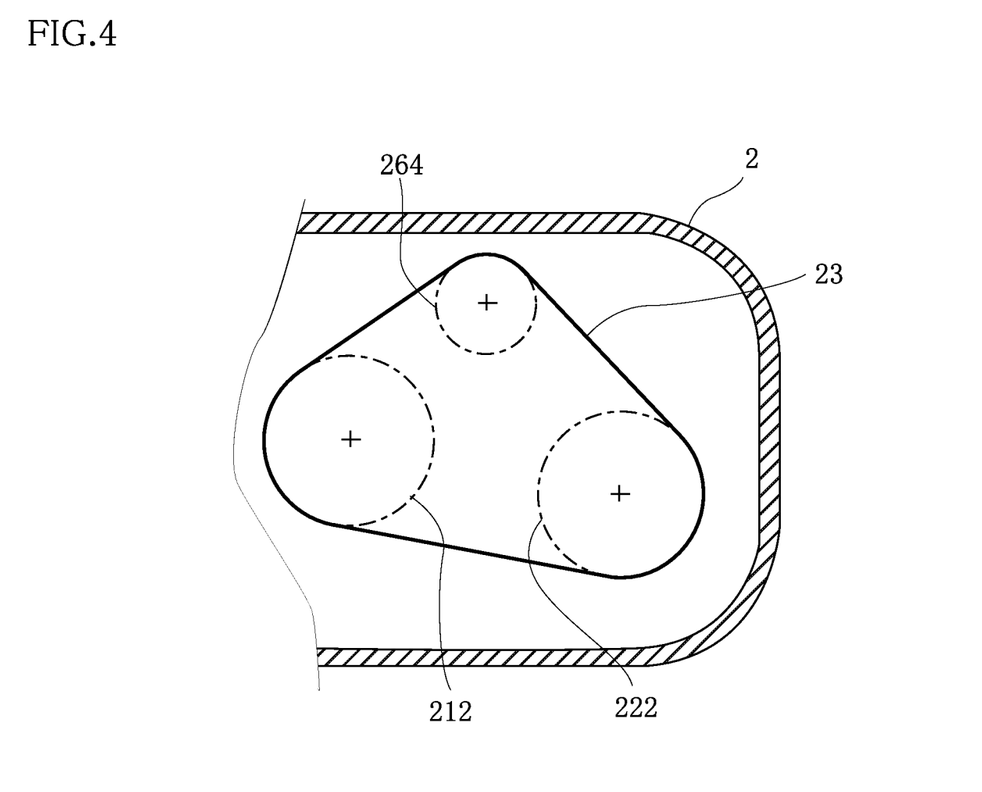
FIG. 4 is a sectional view taken along line III-III of FIG. 2.

The horizontal arm 2 is supported pivotably relative to the support base 131 around the pivot shaft 21. The rotational driving of the horizontal arm 2 is performed by a motor 22 for rotation provided in (more accurately, within) the horizontal arm 2. As shown in FIGS. 3 and 4, an output shaft 22 of the motor 22 is coupled to the support base 131 by an endless belt (endless-loop belt) 23 provided between and passing around a pulley 222 on the output shaft 22 and a pulley 212 coupled to the rotary axis 21 through a speed reducer such as a reduction gear 211. The reduction gear 211 has a high reduction ratio, such as a Harmonic Drive (registered trademark), for example. A reduction rate of this reduction gear is, for example, 1/160 to 1/50. In this embodiment, the motor 22 may preferably be without any reduction function. The ratio of the pulley 212 on the pivot shaft 21 to the pulley 222 on the output shaft 221 of the motor 22 is not limited, and may be 1:1 for example.

Figure 2:
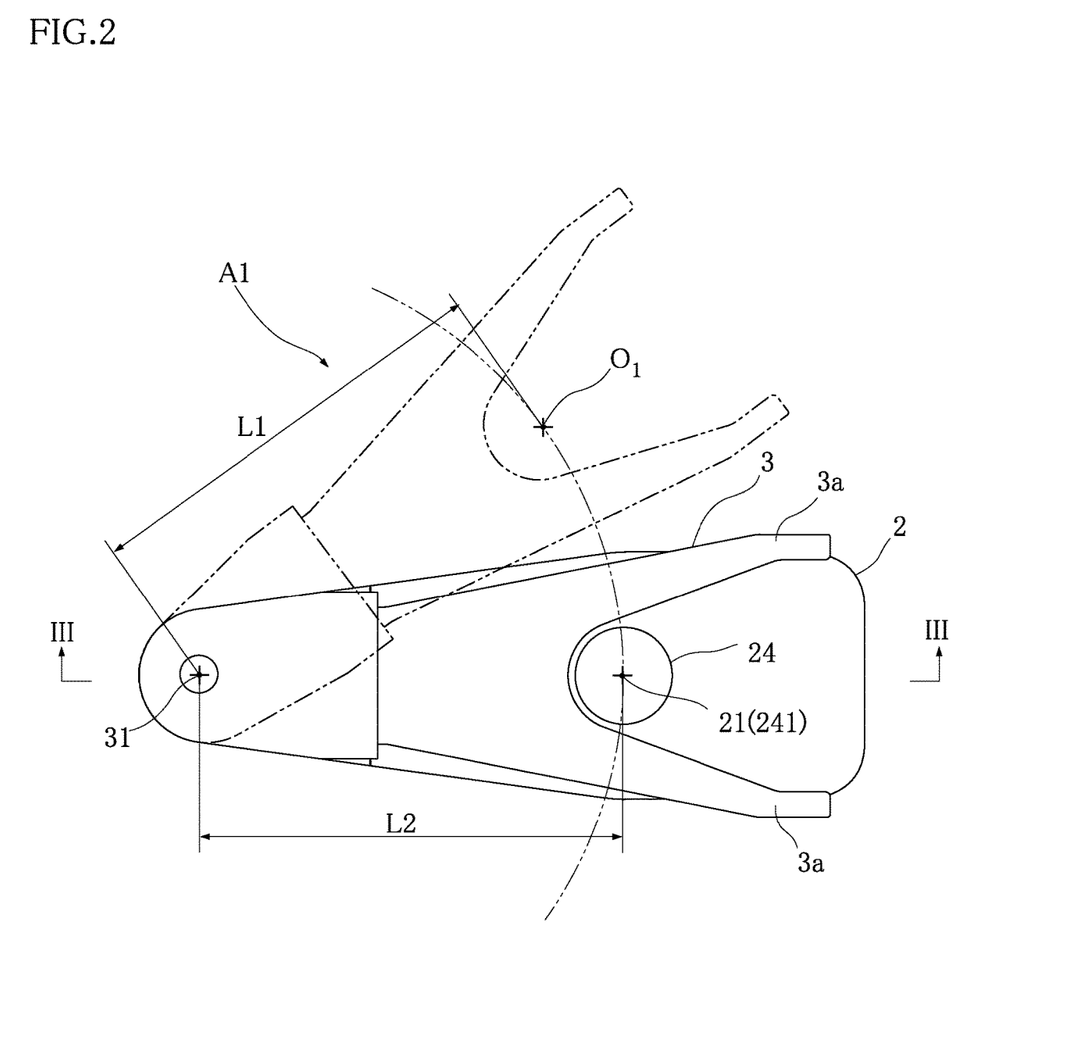
FIG. 2 is a plan view of the horizontal arm.

As shown in FIG. 2, the hand 3 has a fork shape in plane and a holding center $O_1$ where the center of the wafer W held thereon is to be located. In the embodiment shown in the figure, two hands 3 overlapping vertically are pivotably provided around a vertical rotation axis 31. Pivoting of each hand 3 is individually controlled by a motor 32 provided in the horizontal arm 2 through a belt transmission mechanism 33 or by other means. In this embodiment, each hand 3 is configured to hold the wafer W by vacuum pressure suction. Alternatively, the hand 3 may be configured to hold the wafer W by the circumference using a clamping mechanism.

In this embodiment, a rotation stage 24, which has a rotation shaft 241 and is capable of elevating and lowering, is provided on the horizontal arm 2. An example of specific configuration is described below.

As shown in FIG. 3, a support plate 25, which is capable of elevating and lowering by a linear actuator such as an air cylinder 251, and a rotation shaft 241, which has a parallel or collinear axis to the pivot shaft 21, is rotatably supported on this support plate 25. In relation to the rotation shaft 241 and the hand 3, a distance L1 between the rotation shaft 31 of the hand 3 and the holding center $O_1$ is equal to a distance L2 between the rotation shaft 31 of the hand 3 and the rotation shaft 241 of the rotation stage 24 (FIG. 2). The rotation stage 24 is provided at an upper end of the pivot shaft 21. The rotation stage 24 is sized to pass up and down through the space between fork claws 3a of the hand 3, and capable to hold the wafer W placed thereon, for example, by suction. In this embodiment, the rotation shaft 241 of the rotation stage 24 is so located as to be collinear to the pivot shaft 21 of the horizontal arm 2.

An intermediate transmission shaft 26 extending vertically is rotatably supported by an auxiliary plate 252 provided below the support plate 25. The upper end (or upper portion) of the intermediate transmission shaft 26 is inserted through a holder 261 and a spline nut 262, where the holder 261 is fitted into a hole (through-hole) formed in the support plate 25 so as to be fixed to the plate 25, and the spline nut 262 is rotatably attached to the holder 261. The intermediate transmission shaft 26 is a splined shaft, and the spline nut 262 is axially movable and non-rotatable relative to the intermediate transmission shaft 26. Hence, wherever the support plate 25 and the accompanying spline nut 262 are located during their vertical movement, the rotation of the intermediate transmission shaft 26 is transmitted to the spline nut 262, which causes the spline nut 262 to rotate with the intermediate transmission shaft 26. As a commercially available product having the above function performed by a combination of the intermediate transmission shaft 26 (spline shaft), the holder 261, and the spline nut 262, a rotary ball spline, LTR type manufactured by THK CO., LTD. may be suitably used.

A pulley 263 is provided on the spline nut 262, and a pulley 242 is provided on the lower part of the rotary shaft 241 of the rotation stage 24, with an endless belt 27 passing around the pulleys 263, 242. A pulley 264 is provided on the lower end of the intermediate transmission shaft 26, and an endless belt 23 passes around the pulley 264. The endless belt 23 (see FIG. 4) further passes around a pulley 222 provided on the output shaft of the motor 22 and a pulley 212 coupled to the pivot shaft 21 through the reduction gear 211. The ratio of the pulley 222 to the pulley 264 is not limited, but, for example, 1~2:1. When the motor 22 is driven, the horizontal arm 2 pivots around the pivot shaft 21 and the rotation stage 24 simultaneously rotates around the rotation shaft 241. It shoud be noted here that even when the rotation stage 24 makes a complete turn (360°), the pivot angle of the horizontal arm 2 is very small because of the large reduction ratio of the reduction gear 211.

The following describes an example of operation regarding how the wafer W is aligned using the transfer robot A1 of the above configuration.

Figure 5:
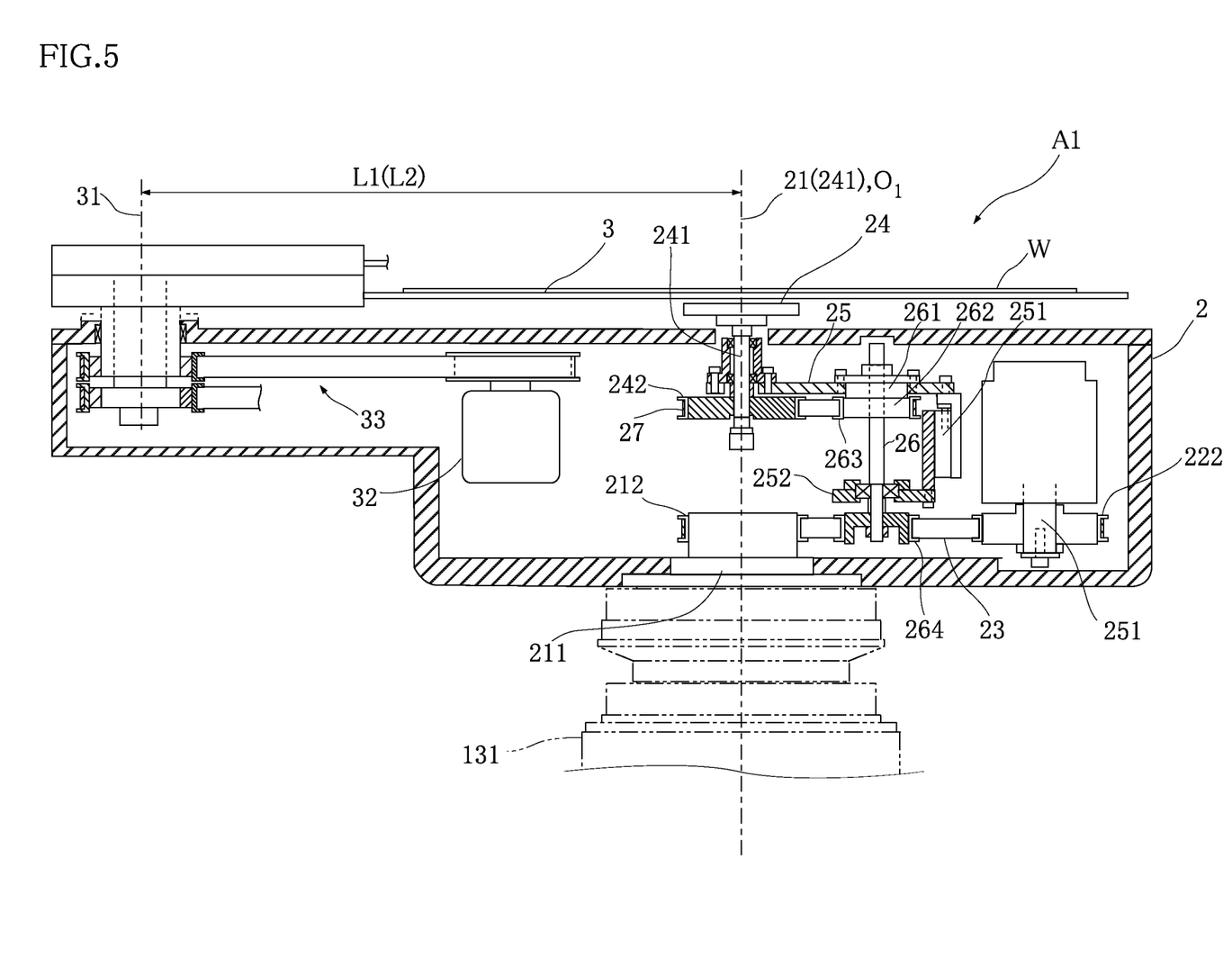
FIG. 5 is a sectional view taken along line III-III of FIG. 2 showing an operation state of the transfer robot.
Figure 6:
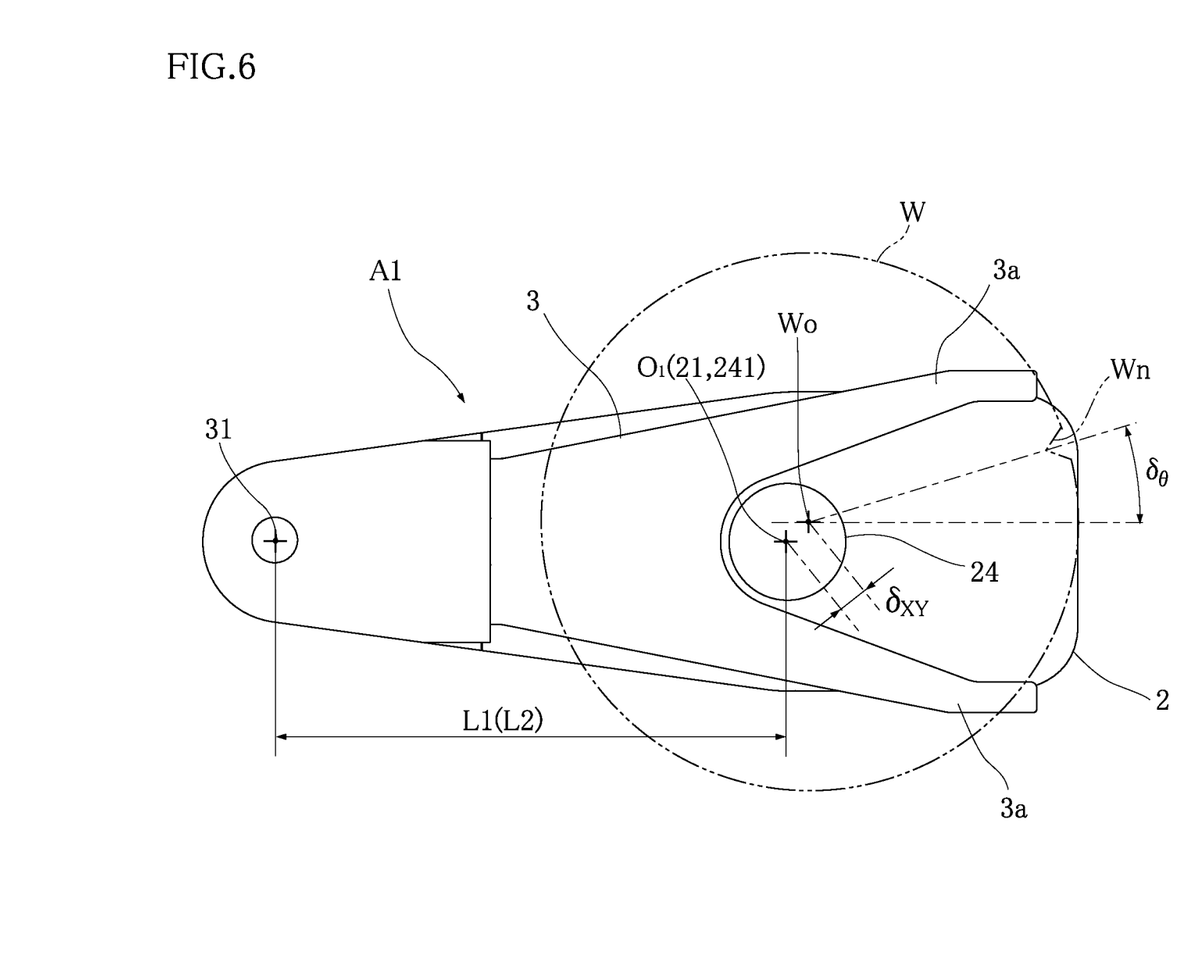
FIG. 6 is a plan view of the horizontal arm showing an operation state of the transfer robot.

As shown in FIG. 5, the rotation stage 24 is placed below the hand 3, and the holding center $O_1$ of the hand 3, which carries the wafer W received from the transfer source, is aligned with the rotation shaft 241 of the rotation stage 24 in plan view. At this time, as shown in FIG. 6, the center $W_O$ of the wafer W may have misalignment in the X-Y direction (an amount of misalignment $\delta_{XY}$) and in the θ direction (an amount of misalignment $\delta_\theta$) relative to the rotation shaft 241 of the rotation stage 24 (the holding center $O_1$ of the hand 3).

Figure 7:
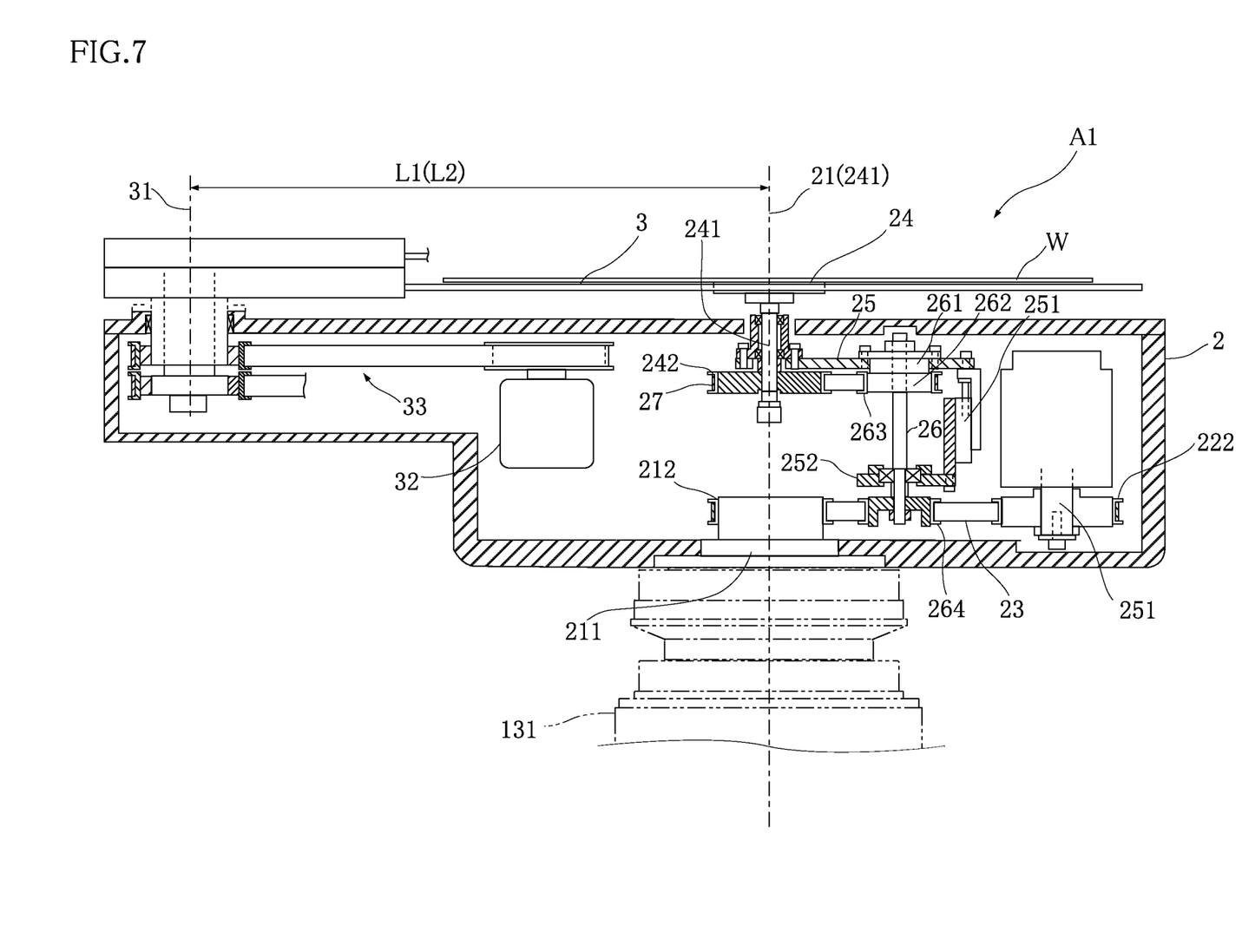
FIG. 7 is a sectional view taken along line III-III of FIG. 2 showing an operation state of the transfer robot.

Next, as shown in FIG. 7, by elevating the rotation stage 24, the wafer W is transferred onto the rotation stage 24. Then, by rotating the rotation stage 24 and continuously detecting the outer circumference of the wafer W with a predetermined sensor, the amount of misalignment in the X-Y direction $\delta_{XY}$ of the center $W_O$ of the wafer W can be detected, where the detected amount corresponds to the misalignment at the time when the wafer W is transferred from the hand 3 onto the rotation stage 24. In addition, the circumference of the wafer W has a notch $W_N$ or an orientation flat, and by simultaneously detecting the notch $W_N$ or orientation flat, the amount of misalignment δθ of the wafer W in the θ direction can be detected, where the detected amount corresponds to the misalignment at the time when the wafer W is transferred from the hand 3 onto the rotation stage 24. The misalignment in the θ direction of the wafer W can be eliminated by rotating the rotation stage 24 in a proper direction based on the amount of misalignment δθ detected as described above. The wafer W, whose misalignment in the θ direction is eliminated in this manner, is transferred onto the hand 3 by lowering the rotation stage 24. Then, the misalignment in the X-Y direction of the wafer W is eliminated by operating the movable mechanism 1 or the horizontal arm 2 so that the hand 3 will transfer the wafer to the destination while correcting the displacement in the X-Y direction based on the amount of misalignment $\delta_{XY}$ detected as described above.

In the above configuration, a separate driving system for the rotation stage 24 is not necessary because the rotation stage 24 is rotationally drive by the output of the motor 22 that rotates the horizontal arm 2.

In rotating the rotation stage 24 as described above, the horizontal arm 2 may also rotate or pivot. However, since the reduction gear 211 with a high reduction ratio is used as described above, the rotation angle of the horizontal arm 2 is small. Thus, advantageously, the horizontal arm 2 does not interfere with peripheral equipment during alignment operation, while the compactness of the entire device can be ensured.

As described above, by the transfer robot A1 in the above configuration, alignment operation can be performed without using a separate aligner, and thus size and cost reduction of the entire transfer system can be achieved. In addition, a wafer W can be transferred between the hand 3 and the rotation stage 24 in a short time, the time required for alignment operation can be reduced and the efficiency of the entire process can be improved.

The present disclosure is not limited to the embodiments described above and intended to cover any modification that can be derived from the scope of the claims.

For example, in the above embodiment, the rotation shaft 241 of the rotation stage 24 and the rotation axis 21 of the horizontal arm 2 are aligned, though this is not necessary. For instance, it may be sufficient to arrange that the distance L1 between the rotation axis 31 of the hand 3 and the holding center O1 is equal to the distance L2 between the rotation axis 31 of the hand 3 and the rotation shaft 241 of the rotation stage 24.

The configuration for elevating and lowering the rotation stage 24, which rotates using the output of the motor 22 of the horizontal arm 2, is also not limited to the configuration of the illustrated embodiment.

Furthermore, the movable mechanism 1 transferring the support base 131 that supports the horizontal arm 2 is also not limited to the configuration of the above embodiment. Other configurations may be adoptable for the movable mechanism as long as they ensure that the support base 131 is movable to any desired position in the vertical plane.

REFERENCES

A1: transfer robot W: wafer (planar piecework) $W_O$: center (of the wafer) 1: movable mechanism (robot) 131: support base 2: horizontal arm 21: pivot shaft (first shaft or axis) 211: reduction gear 212: pulley 22: motor for rotation 221: output shaft 222: pulley 23: endless belt 24: rotation stage 241: rotation shaft (third shaft or axis) 264: pulley 27: endless belt 3: hand 31: rotation shaft (second shaft or axis)

The invention claimed is:

1. A transfer robot comprising:
   a movable mechanism;
   a support base moved by the movable mechanism;
   a horizontal arm pivotable relative to the support base around a first axis that is vertical;
   a motor provided in the horizontal arm to pivot the horizontal arm; and
   a hand disposed above the horizontal arm and rotatable relative to the horizontal arm around a second axis parallel to the first axis, the hand configured to hold a planar workpiece placed thereon,
   wherein the horizontal arm is provided with a rotation stage configured to hold the planar workpiece placed thereon, the rotation stage being rotatable around a third axis parallel to the first axis and movable up and down along an axial direction of the third axis,
   the hand has a holding center corresponding to a center of the planar workpiece, the holding center being moved along a rotational trajectory extending across the third axis in plan view, and
   the rotation stage is rotated by an output of the motor provided in the horizontal arm, wherein the first axis and the third axis are coaxial.

2. The transfer robot according to claim 1, wherein the rotation stage includes a rotation stage shaft for transmitting a rotational power to the rotation stage, wherein the rotation stage shaft, an output shaft of the motor and the first axis are provided with respective pulleys around which a belt passes in common.

3. The transfer robot according to claim 2, further comprising a reduction gear provided between the pulley on the first axis and the support base.

4. The transfer robot according to claim 3, wherein the reduction gear has a reduction ratio in a range of 1/160 and 1/50.

5. The transfer robot according to claim 4, wherein the motor, the pulley on the output shaft of the motor, the rotation stage shaft, the pulley on the rotation stage shaft, the pulley on the first axis, and the belt are provided within the horizontal arm.

\* \* \* \* \*